(12) United States Patent
Simonin (10) Patent No.: US 9,640,975 B2
(45) Date of Patent: May 2, 2017

(54) CONTROLLABLE TEST-PULSE WIDTH AND POSITION FOR SELF-TEST GROUND FAULT CIRCUIT INTERRUPTER

(71) Applicant: Hubbell Incorporated, Shelton, CT (US)

(72) Inventor: Stephen Simonin, Northfield, CT (US)

(73) Assignee: Hubbell Incorporated, Shelton, CT (US)

( * ) Notice: Subject to any disclaimer, the term of this patent is extended or adjusted under 35 U.S.C. 154(b) by 117 days.

(21) Appl. No.: 14/468,224

(22) Filed: Aug. 25, 2014

(65) Prior Publication Data

US 2015/0062760 A1    Mar. 5, 2015

Related U.S. Application Data

(60) Provisional application No. 61/870,452, filed on Aug. 27, 2013.

(51) Int. Cl.
| H02H 3/16 | (2006.01) |
| G01R 31/02 | (2006.01) |
| G01R 31/327 | (2006.01) |
| H02H 3/33 | (2006.01) |

(52) U.S. Cl.
CPC ......... H02H 3/162 (2013.01); G01R 31/3277 (2013.01); H02H 3/335 (2013.01)

(58) Field of Classification Search
CPC ....... G01R 31/025; H02H 3/162; H02H 3/335
USPC .......................................................... 361/42
See application file for complete search history.

(56) References Cited

U.S. PATENT DOCUMENTS

| 2006/0125622 A1* | 6/2006 | Baldwin | ................ H01H 83/04 340/514 |
| 2012/0257314 A1* | 10/2012 | Armstrong | ......... G01R 31/3272 361/42 |
| 2014/0268436 A1* | 9/2014 | Du | ....................... H02H 11/002 361/42 |

* cited by examiner

*Primary Examiner* — Scott Bauer
(74) *Attorney, Agent, or Firm* — Michael Best & Friedrich, LLP (57) ABSTRACT

A circuit interrupting device having an auto-monitoring circuit for periodically testing various functions and structures of the device. The auto-monitoring circuit initiates an auto-monitoring routine which, among other things, generates a self-test fault condition and determines whether the detection mechanisms within the device properly detect the self-test fault. A test fault circuit is configured to generate one or more test pulses that cause the self-test fault condition and the test pulses are generated to occur outside of an active region of the fault detection circuit.

12 Claims, 7 Drawing Sheets

CONTROLLABLE TEST-PULSE WIDTH AND POSITION FOR SELF-TEST GROUND FAULT CIRCUIT INTERRUPTER

CROSS-REFERENCE TO RELATED APPLICATIONS

This application claims the benefit of U.S. Provisional patent application No. 61/870,452 filed on Aug. 27, 2013. This application also contains subject matter related to subject matter contained in U.S. patent application Ser. No. 13/827,785, titled, "GFCI TEST MONITOR CIRCUIT," by Stephen P. Simonin, the entire content of which is incorporated herein by reference for all that is disclosed.

FIELD

The present invention relates generally to switched electrical devices. More particularly, various embodiments of the present invention is directed to a self-testing circuit interrupting device, such as a ground fault circuit interrupter (GFCI) or an arc-fault circuit interrupter (AFCI), that periodically automatically tests its ability to detect a fault condition. A device consistent with embodiments of the invention disclosed herein has robust self-testing capabilities such that test-pulses generated within the device to simulate real fault conditions are controlled in a manner to minimize the chances of the automatic self-test conditions causing the device to trip and/or the chances of such self-test conditions to go undetected by the detection circuit of the device.

BACKGROUND

The function of circuit interrupting devices, such as GFCIs and AFCIs, is to detect fault conditions that may result in shock or fire hazard and remove the fault condition. Such circuit interrupting devices first detect the fault condition and then remove power to the load circuit in response to that detection. Interrupting contacts within the device are opened to break the electrical connection between the input power terminals, typically connected to an AC source, and load terminals, which are usually connected directly or indirectly to an electrically powered device.

To be commercially sold in the United States a GFCI device, for example, must conform to standards established by the Underwriter's Laboratory (UL). These standards are typically created in conjunction with industry-leading manufacturers as well as other industry members, such as various safety groups. One UL standard covering GFCI devices is UL-943, titled "Standard for Safety—Ground Fault Circuit Interrupters." UL-943 applies to Class A, single- and three-phase, GFCIs intended for protection of personnel and includes minimum requirements for the function, construction, performance, and markings of such GFCI devices. UL-943 requires, among other things, specific fault current levels and response timing requirements at which the GFCI device should trip. Typically, GFCIs are required to trip when a ground fault having a level higher than 5 milliamps (mA) is detected. Further, when a high resistance ground fault is applied to the device, the present version of UL-943 specifies that the device should trip and prevent current from being delivered to the load in accordance with the equation, $T=(20/I)1.43$, where T refers to time and is expressed in seconds and I refers to electrical current and is expressed in milliamps. Thus, in the case of a 5 mA fault, the device must detect the fault and trip in 7.26 seconds or less.

With such safety-related standards in place, and because GFCI devices are directly credited with saving many lives since their introduction in the early 1970s, they have become ubiquitous throughout the residential and commercial electrical power grid. Like most electro-mechanical devices, however, GFCI devices are susceptible to failure. For example, one or more of the electronic components that drive the mechanical current interrupter device can short-out or otherwise become defective, as can components in the fault detector circuit or elsewhere within the device, rendering the device unable to properly detect the ground fault and/or properly interrupt the flow of electrical current. For this reason it has long been required that GFCI devices be provided with a supervisory circuit that enables manual testing of the ability of the device to trip when a fault is encountered. Such supervisory circuits typically include a TEST button which, when pressed, actuates a simulated ground fault on the hot and neutral conductors. If the device is functioning properly the simulated fault is detected and the device will trip, i.e., the mechanical interrupter is actuated to open the current path connecting the line side of the device, e.g., where the in AC power is supplied, and load side, where the user connects his or her electrical appliance, etc. and where downstream receptacles or additional GFCI devices are connected.

A study performed by industry safety groups indicated that most often the public does not regularly test their GFCI devices for proper operation, i.e., by pressing the TEST button. This study further revealed that some GFCI devices that had been in service for an extended period of time became non-functional and were unable to properly detect a fault condition, thus, rendering the device unsafe. Specifically, it was discovered that after extended use GFCI devices fail to trip when a fault occurs, thus rendering the device operable as an electrical receptacle but unsafe in the presence of a fault condition. Because the devices are not being regularly tested, this unsafe condition is exacerbated. That is, people unwittingly believe that the device is operational, because it adequately delivers power, when in fact the device is a potentially life-threatening hazard.

The discovery that GFCI devices deployed in the field are becoming increasingly non-operational and unsafe in combination with the realization that people do not regularly test their GFCI devices, regardless of manufacturer's explicit instructions to do so, initiated investigations into possible changes to the UL-943 standard to require the GFCI devices to self-test (e.g., "auto-monitor") themselves without the need for human intervention. The contemplated changes to UL-943 further include a requirement for either a warning to the consumer of the loss of protection and/or the device automatically removing itself from service, e.g., permanently tripping. Moreover, these additional self-testing operations would have to be performed without interfering with the primary function of the device, i.e., tripping when an actual fault was encountered.

The revised self-test functionality mentioned above is not yet a requirement for UL-943 certification, but it is expected that it will be soon. In preparation for this significant UL standard change, and in view of the seemingly endless reduction in the cost of integrated circuits, many GFCI manufacturers have migrated to digital techniques (e.g., microprocessors and microcontrollers) in favor of previous analog designs to provide both ground fault protection and self-monitoring functionality. The digital solutions offered thus far, however, are not ideal. For example, several related art GFCI designs, including those directed at providing self-test functionality, suffer from nuisance tripping, a situation where the interrupter is actuated when neither a real ground fault, a manually generated simulated ground fault, nor an automatic self-test fault are present. This unfavorable condition is made worse when, as is the case with most related art self-test devices, additional inductive currents are generated within the device.

It is, therefore, desired to provide a circuit interrupting device that provides certain self-testing capabilities, including those proposed for the next revision of UL-943, and minimizes nuisance tripping resulting from the self-test operation and maximizes the chances that a self-test fault will be properly detected.

SUMMARY OF EXEMPLARY EMBODIMENTS

The present invention is directed to a self-testing circuit interrupting device, such as a ground fault circuit interrupter (GFCI) or an arc-fault circuit interrupter (AFCI), that periodically automatically tests its ability to detect a fault condition.

One aspect of the invention is to provide an electrical wiring device that has a robust self-testing capability such that the device will successfully self-test its functionality under various non-ideal conditions that render other such devices less desirable due to false positive fault detection within the device.

A wiring device consistent with one embodiment includes a fault detection circuit configured to detect real, simulated and test fault conditions and a test fault circuit configured to generate one or more test pulses that generate the test fault condition, wherein the one or more test pulses are generated to occur outside of an active region of the fault detection circuit.

According to a further aspect the one or more test pulses each has a pulsewidth that is less than 1 msec.

According to a further aspect a leakage current is present in the active region of the fault circuit. This condition is one of several conditions that cause conventional self-testing devices to fail or otherwise provide false or unreliable self-testing results.

According to yet a further aspect of the invention a circuit interrupting device is provided that includes one or more line conductors for electrically connecting to an external power supply, one or more load conductors for electrically connecting to an external load, an interrupting device connected to the line conductors and the load conductors and electrically connecting the line conductors to the load conductors when the circuit interrupting device is in a reset condition and disconnecting the line conductors from the load conductors when the circuit interrupting device is in a tripped condition, a fault detection circuit that detects a fault condition in the circuit interrupting device and generates a fault detection signal when the fault condition is detected, wherein the fault detection signal is provided to the interrupting device to place the circuit interrupting device in the tripped condition, an auto-monitoring circuit electrically coupled to the fault detection circuit and the interrupting device and continuously monitoring one or more signals to determine an operating state of the circuit interrupting device and a test fault circuit configured to generate one or more test pulses that cause the test fault condition, wherein the one or more test pulses are generated to occur outside of an active region of the fault detection circuit.

According to another aspect an electrical an electrical wiring device is provided that includes a fault detection circuit configured to detect real, simulated and test fault conditions, a test fault circuit configured to generate one or more test pulses that cause the test fault condition, wherein the test fault circuit includes a programmable device programmed to generate the one or more test pulses only within the last quarter of a positive half-cycle of AC power.

These and other aspects of the invention will become apparent from the following detailed description of the invention, which in conjunction with the annexed drawings, disclose various embodiments of the invention.

BRIEF DESCRIPTION OF THE DRAWINGS

The following is a brief description of the drawings in which.

DETAILED DESCRIPTION OF EXEMPLARY EMBODIMENTS

The above described disadvantages are overcome and advantages are realized by a circuit that provides a controlled self-test test pulse for simulating a real fault condition. According to embodiments of the invention, the self-test pulse is controlled to be generated at an optimum time during the self-test operation and/or to have an optimum pulse-width that permits sufficient testing of the detector circuit and minimizes the chances of the self-test pulse coinciding with a leakage current.

According to at least one exemplary embodiment a self-test circuit is provided that includes a microcontroller device programmed to generate one or more self-test pulses that cause a test ground fault. The test pulses are generated outside the detection circuit's typical detection area which guarantees that the test pulses do not add or subtract to normal leakage values, a situation that would have otherwise caused false trips or non-trips, respectively.

For example, referring to FIGS. 1A-1D, microcontroller 301 generates one or more test pulses on input/output (I/O) port GP1. The test pulses place a signal on the base of transistor 304, turning the transistor ON which, in turn, draws current through the transistor on conductor 356. When there is a net current drawn through sense transformer 334, e.g., on conductor 356, a flux is generated causing a signal to be generated on conductor 333, which is detected by GFCI IC device 350. That is, when the net flux is generated by the signal on conductor 356, a real ground fault is simulated.

According to the embodiment of the invention, the resulting pulsed detection signal on conductor 333 is provided to the input ports of the GFCI IC device 350 which, according to this embodiment is a known 4141 GFCI chip. However, those of ordinary skill in the art would know that other GFCI devices, such as a 4145 device or an LM1851 device, can also be used without departing from the spirit and scope of the invention. It is further noted that although the present embodiment is described using the positive half-cycle as comprising the active region, one of skill would understand that with minor alterations to the circuit the negative half-cycle could also be used.

Still referring to FIGS. 1A-1D, the periodic test pulses activate all necessary circuits and components necessary to confirm proper operation of the device, except for the interrupter, which should not be activated during an auto-monitoring (self-test) operation. The test pulse activates all circuits and carrier coils, input electronics, GFCI chip, and all follow on electronics. Specifically, when the signal is generated on conductor 333, proper functioning of the entire detection circuit, including the GFCI IC device 350, is tested by measuring the signal on TP 2 with microcontroller 301 and confirming that the detection signal occurred at the appropriate time and had the appropriate level.

Figure 1A:
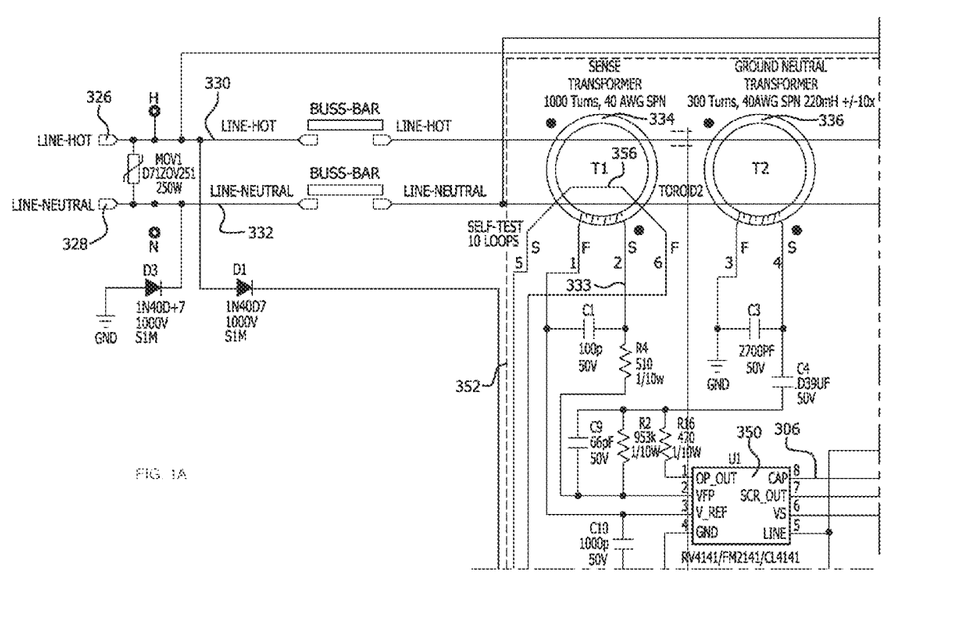
FIGS. 1A-1D is a schematic illustrating a circuit interrupting device in accordance with at least one embodiment of the invention.
Figure 1B:
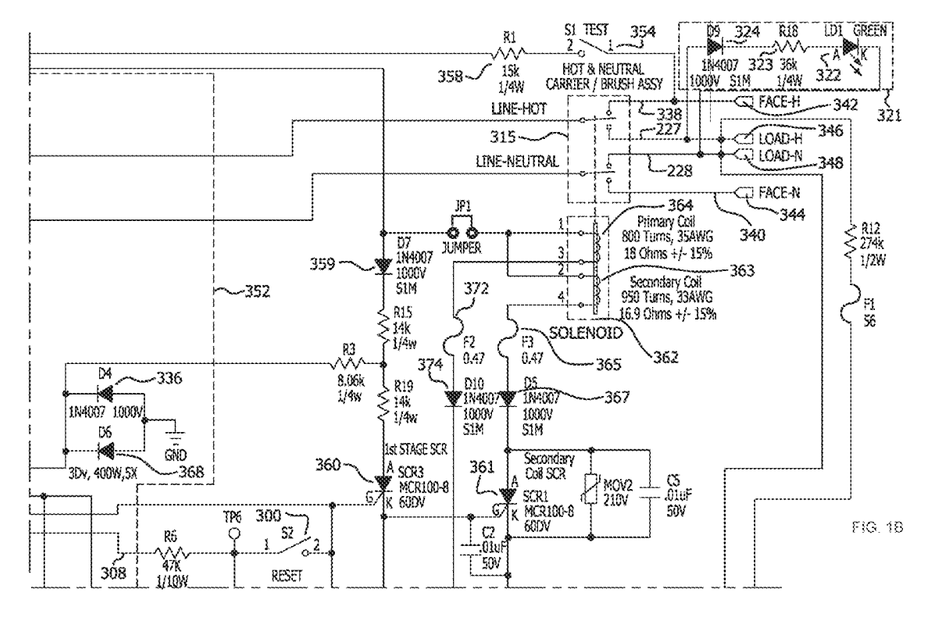
Figure 1C:
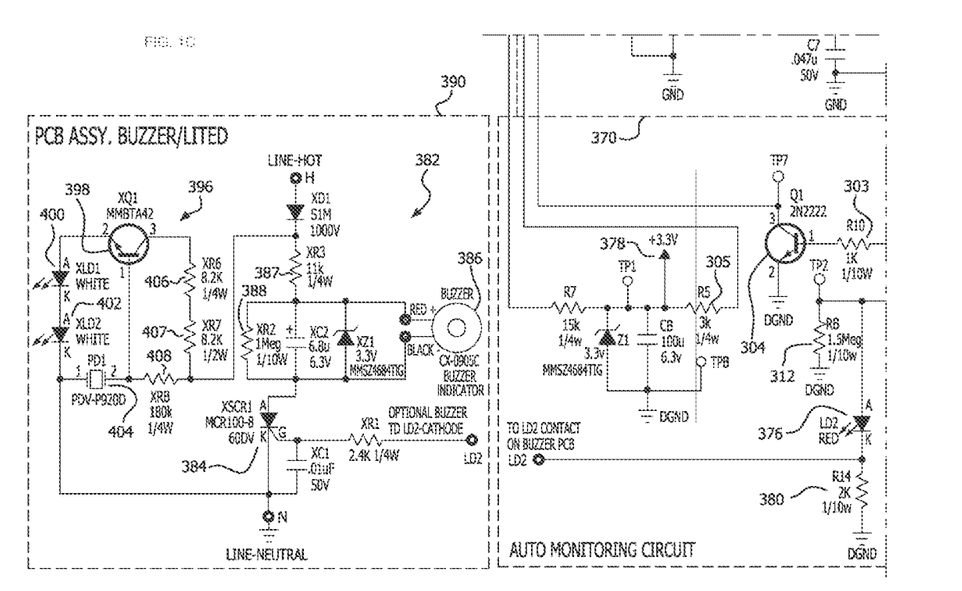
Figure 1D:
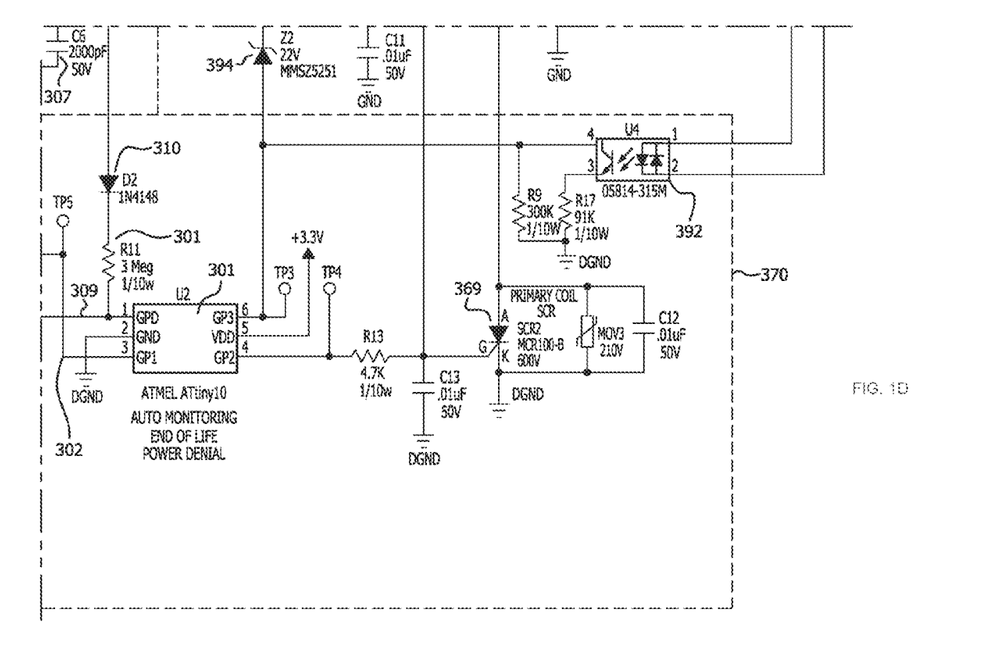
Figure 2:
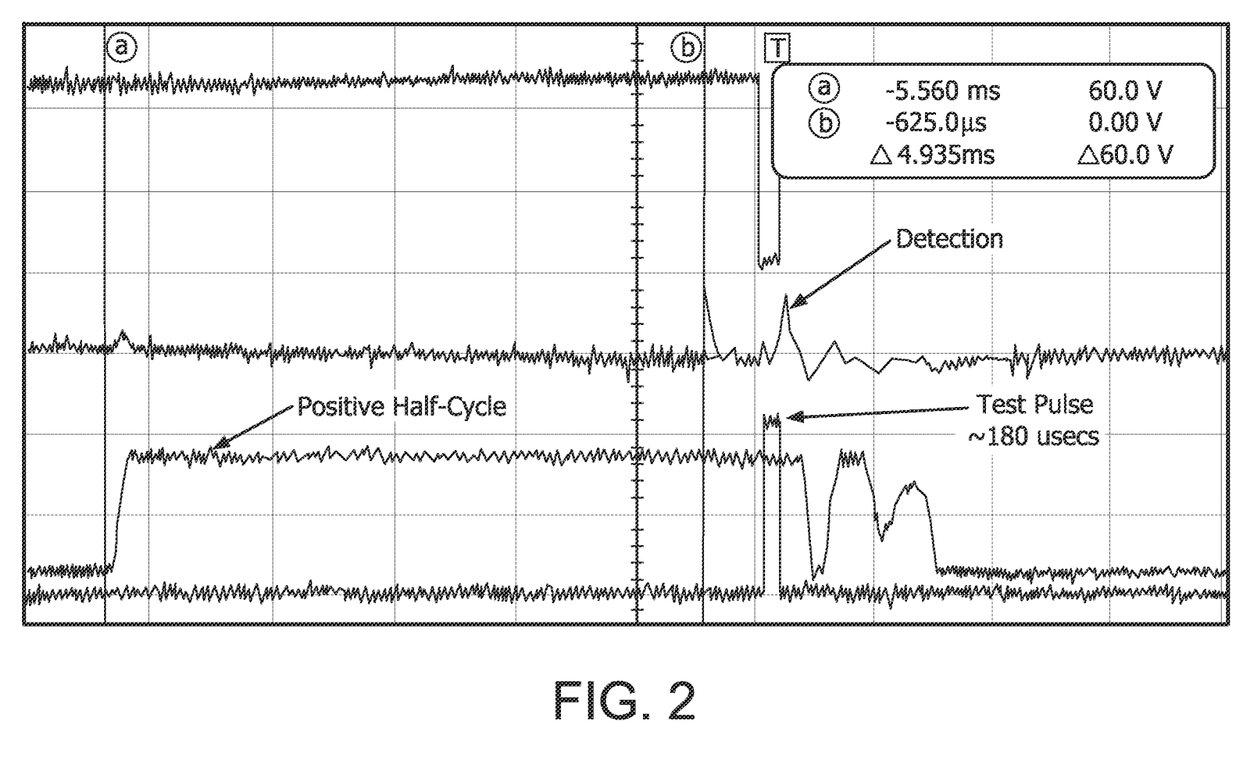
FIG. 2 is a signal diagram showing various signals in the circuit of FIG. 1 and their relative levels in accordance with at least one embodiment of the invention when there is no leakage current present.

As shown in FIG. 2, the "Test Pulse," which is measured on TP 5 of FIG. 1, is generated approximately 5 milliseconds (msec) after the leading edge of the active leakage area and the width of the pulse is controlled to be relatively narrow compared to the mains half-wave pulse. More particularly, the pulsewidth of the test pulse that generates the automatic test ground fault signal is controlled by microcontroller 301 in 1 μsec increments and the location of the pulse within the half-wave AC mains pulse is also controlled. For example, according to this embodiment the pulsewidth is controlled to be approximately 180 microseconds (μsec) and its timing is controlled such that its leading edge is located at least 5 msecs after the leading edge of the positive half-cycle of the rectified AC power signal, i.e., as measured on TP 3 of FIG. 1. It is expressly noted here that the present invention is contemplated to operate when either an AC source or a DC source is used. By placing the test pulse towards the latter portion of the AC half-wave, the test fault signal is still detected by the GFCI IC chip, as described in further detail below, but the test fault signal is not added, or subtracted, from any leakage current signal located in the active leakage portion of the half-wave power signal.

Referring to FIG. 2, the test fault is detected by the GFCI IC device 350 as indicated by the positive signal measured on TP 2 of FIG. 1. In this particular case no leakage current is present during the active region of the AC positive half-wave signal. The signal at TP 2 represents the output of a delay capacitor within the GFCI IC device that charges up when a signal exceeding the predetermined threshold is present at the input ports of the GFCI IC device, e.g., on conductor 333, as a result of the flux generated at sense transformer 334. The signal at TP 2 is measured by an analog-to-digital (A/D) converter within microcontroller 301 and counted as a valid auto-monitor test fault if the measured value exceeds a predetermined threshold indicative of a fault.

Figure 3:
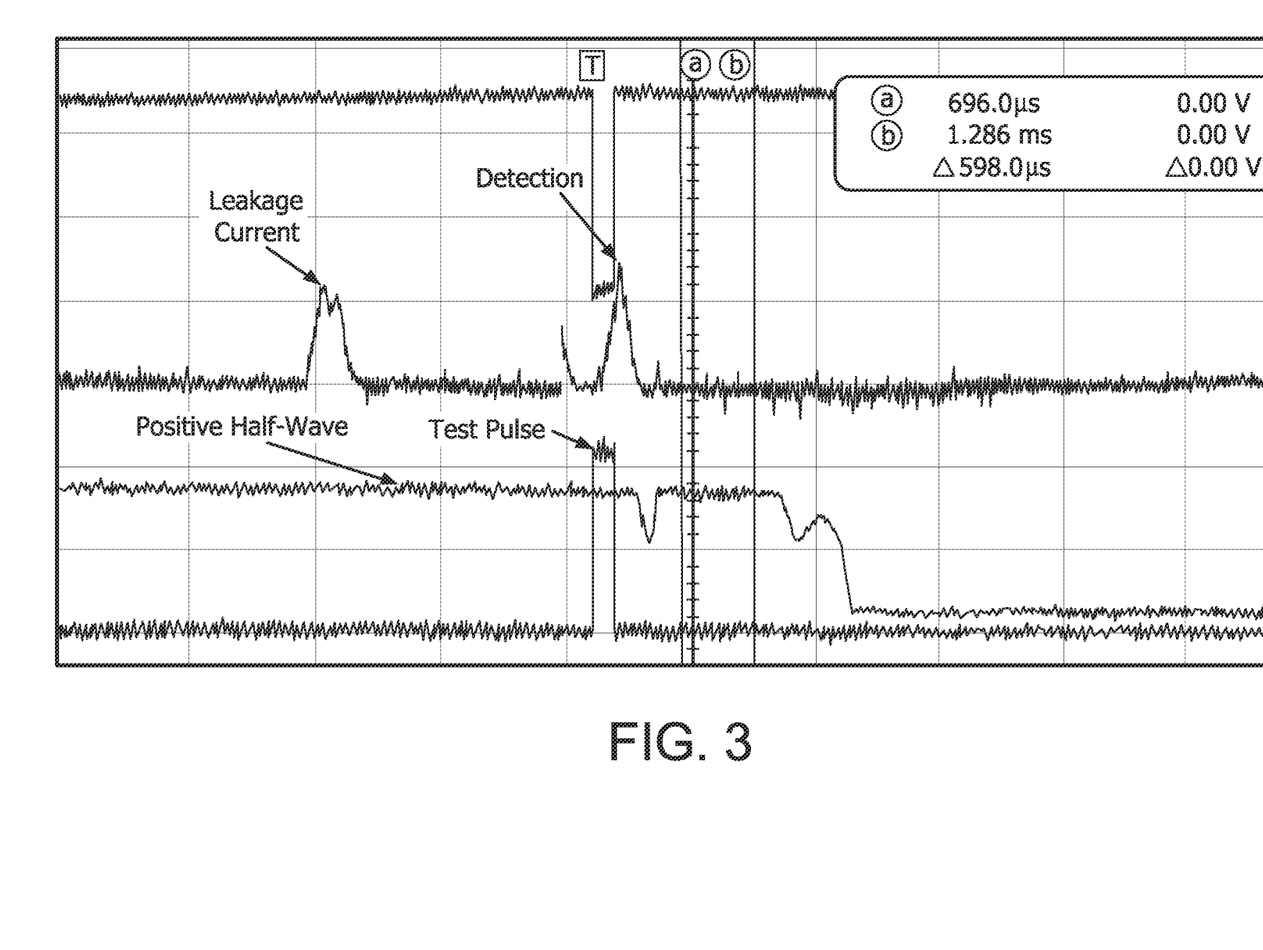
FIG. 3 is a signal diagram showing various signals in the circuit of FIG. 1 and their relative levels in accordance with at least one embodiment of the invention when leakage current is present.

Referring to FIG. 3, a leakage current is generated approximately in the center of the positive half-wave of the AC power signal and within the active region, e.g., 2-3 msec from the leading edge. Because the test pulse is generated near the end of the positive half-wave, similar to FIG. 2, the detection of the test pulse occurs cleanly, e.g., without any additional noise or ringing observed on the output of the delay capacitor (TP 2 on FIG. 1). That is, the detection signal immediately following the test pulse when the test pulse is near the end of the AC positive half-wave and leakage occurs in the active region (FIG. 3) appears identical to the detection signal when no leakage is present (FIG. 2). Also, because of the position of the test pulse, the SCR cannot fire. That is, as shown for this embodiment, the SCR cannot fire in the 6 to 7 msec time period as the mains power is dropping to zero level, e.g., if a positive pulse is used.

Figure 4:
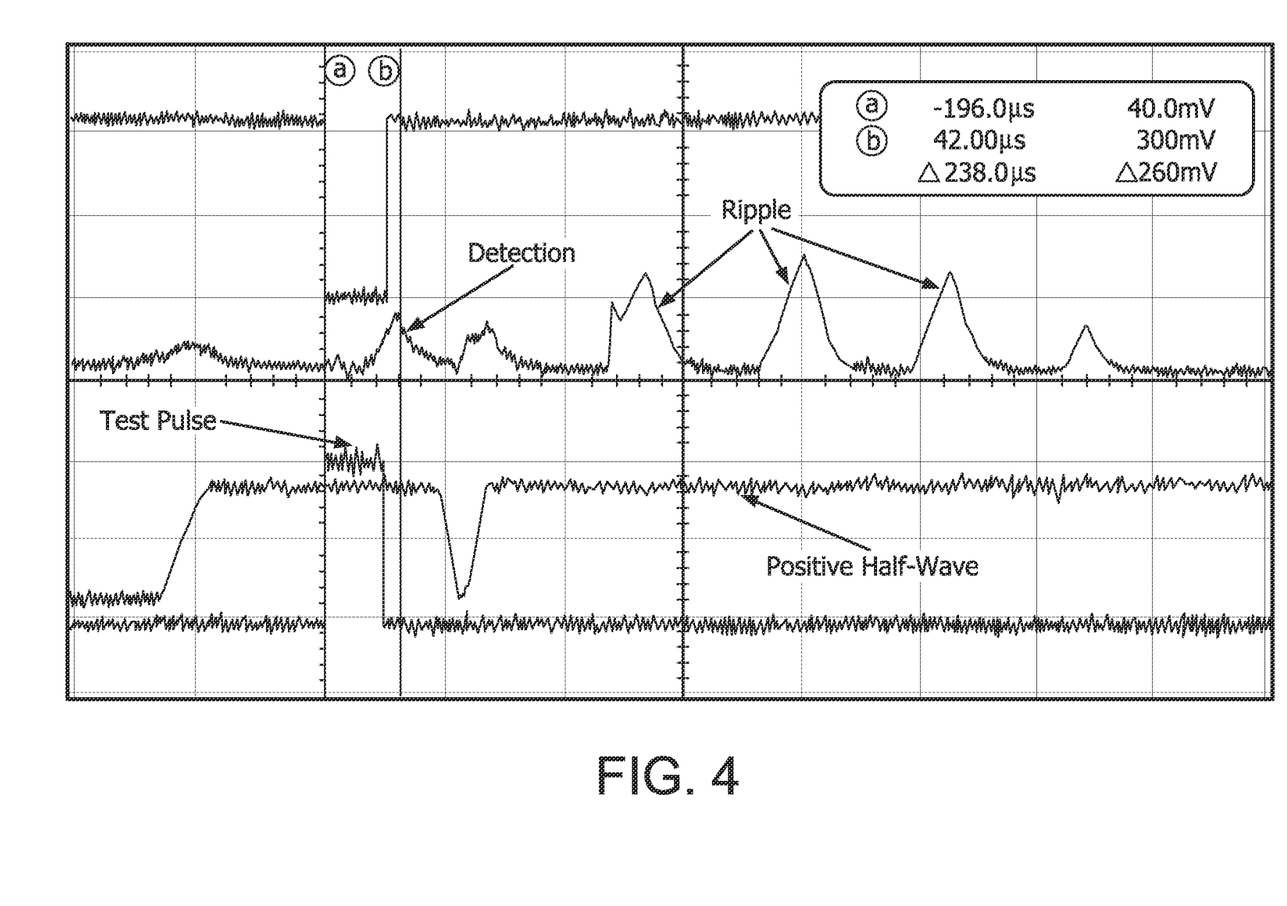
FIG. 4 is a signal diagram showing various signals in the circuit of FIG. 1 and their relative levels when a test pulse occurs at the beginning of the positive AC half-wave.

As shown in FIG. 4, a test pulse at the beginning of the positive AC half-wave, even a test pulse having a short pulsewidth, e.g., approximately 180 msec. as shown, causes ripple, or oscillations, on the detection signal during the active region of the half-wave signal. That is, instead of the A/D converter in the microcontroller measuring a clean detection signal subsequent to the test pulse, as in FIGS. 2 and 3, when the test pulse occurs close to the leading edge of the positive AC half-wave, a true reading of the detection circuit, e.g., the GFCI IC device, cannot be obtained.

Moreover, if the test pulse, or pulses, occur during the active region, for example, less than 5 msec from the leading edge of the AC half-wave, the test pulses will add to, or subtract from, any leakage current. For example, referring to FIG. 3, if the test pulse had occurred at the same time as leakage current, i.e., within the active region, the detection signal would add to the leakage current signal and the resulting voltage at TP 2 of FIG. 1 would be high enough to trip the device, even if the value of the leakage current would not have been high enough to trip the device by itself. In this scenario, a nuisance, or false, trip would occur.

Similarly, if the test pulse occurred at the same time as a leakage signal and the test pulse resulted in a negative detection signal, the detection signal would be subtracted from the leakage signal when they are summed. This situation could, thus, result in a leakage signal that would have otherwise caused the device to trip to be lowered to a level that does not result in a trip condition. Both situations described above, i.e., where the detection signal causes a leakage signal to be increased or decreased, is unfavorable because it interferes with the usual operation of the device.

What is claimed is:

1. An electrical wiring device comprising:
   a fault detection circuit configured to detect real, simulated and test fault conditions; and
   a test fault circuit configured to generate one or more test pulses that cause said test fault condition, wherein said one or more test pulses are generated to occur outside of an active region of said fault detection circuit, and wherein said one or more test pulses occur approximately five milliseconds after a leading edge of a positive half-cycle of AC power, such that the one or more test pulses will not add to and will not subtract from a leakage current.

2. The electrical wiring device recited in claim 1, wherein said one or more test pulses each has a pulsewidth that is less than 1 msec.

3. The electrical wiring device recited in claim 1, wherein a leakage current is present in the active region.

4. The electrical wiring device recited in claim 1, wherein said one or more test pulses are generated by a programmable device.

5. The electrical wiring device recited in claim 1, wherein said one or more test pulses are generated so as to avoid a leakage current.

6. A circuit interrupting device comprising:
   one or more line conductors for electrically connecting to an external power supply;
   one or more load conductors for electrically connecting to an external load;
   an interrupting device connected to said line conductors and said load conductors and electrically connecting said line conductors to said load conductors when said circuit interrupting device is in a reset condition and disconnecting said line conductors from said load conductors when said circuit interrupting device is in a tripped condition;

a fault detection circuit that detects a fault condition in said circuit interrupting device and generates a fault detection signal when said fault condition is detected, wherein said fault detection signal is provided to said interrupting device to place said circuit interrupting device in said tripped condition;

an auto-monitoring circuit electrically coupled to said fault detection circuit and said interrupting device and continuously monitoring one or more signals to determine an operating state of said circuit interrupting device; and a test fault circuit configured to generate one or more test pulses that cause said test fault condition, wherein said one or more test pulses are generated to occur outside of an active region of said fault detection circuit, and wherein said one or more test pulses occur approximately five milliseconds after a leading edge of a positive half-cycle of AC power, such that the one or more test pulses will not add to and will not subtract from a leakage current.

7. The circuit interrupting device recited in claim 6, wherein said fault detection circuit includes a sense transformer through which said line conductors are disposed, said sense transformer generating an induced fault detection signal when a net current exceeds a predetermined threshold.

8. The circuit interrupting device recited in claim 7, wherein said self-test circuit includes a self-test conductor disposed through said sense transformer and separate from said line conductors and said net current is placed on said self-test conductor when said self-test circuit is controlled to generate said self-test signal.

9. An electrical wiring device comprising:
a fault detection circuit configured to detect real, simulated and test fault conditions;
a test fault circuit configured to generate one or more test pulses that cause said test fault condition, wherein said one or more test pulses are generated to occur outside of an active region of said fault detection circuit,
wherein said test fault circuit includes a programmable device programmed to generate said one or more test pulses, such that said one or more test pulses occur approximately five milliseconds after a leading edge of a positive half-cycle of AC power, such that the one or more test pulses will not add to and will not subtract from a leakage current.

10. The electrical wiring device recited in claim 9, wherein said one or more test pulses each has a pulsewidth that is less than 1 msec.

11. The electrical wiring device recited in claim 9, wherein a leakage current is present in the active region.

12. The electrical wiring device recited in claim 9, wherein said one or more test pulses are generated so as to avoid a leakage current.

* * * * *